US 8,717,210 B2
(45) Date of Patent: May 6, 2014

(12) United States Patent
Eldar et al.

(10) Patent No.: US 8,717,210 B2

(54) MULTI-CHANNEL SAMPLING OF PULSE STREAMS AT THE RATE OF INNOVATION

(75) Inventors: Yonina Eldar, Haifa (IL); Kfir Gedalyahu, Tel Aviv (IL); Ronen Tur, Binyamina (IL)

(73) Assignee: Technion Research & Development Foundation Ltd., Haifa (IL)

( * ) Notice: Subject to any disclaimer, the term of this patent is extended or adjusted under 35 U.S.C. 154(b) by 0 days.

(21) Appl. No.: 13/640,048

(22) PCT Filed: Apr. 5, 2011

(86) PCT No.: PCT/IB2011/051449
§ 371 (c)(1),
(2), (4) Date: Oct. 9, 2012

(87) PCT Pub. No.: WO2011/135472
PCT Pub. Date: Nov. 3, 2011

(65) Prior Publication Data
US 2013/0038479 A1 Feb. 14, 2013

Related U.S. Application Data

(60) Provisional application No. 61/328,228, filed on Apr. 27, 2010.

(51) Int. Cl.
*H03M 1/00* (2006.01)
(52) U.S. Cl.
USPC ........... 341/122; 341/141; 341/155; 342/175; 600/447
(58) Field of Classification Search
USPC .......................................... 341/122, 141, 155
See application file for complete search history.

(56) References Cited

U.S. PATENT DOCUMENTS

| 5,414,623 | A | 5/1995 | Lu et al. |
| 5,812,605 | A | 9/1998 | Smith et al. |
| 6,018,600 | A | 1/2000 | Levin et al. |
| 6,806,708 | B1 | 10/2004 | Lee et al. |
| 7,280,615 | B2 * | 10/2007 | Roberts .......................... 375/316 |
| 7,636,403 | B2 | 12/2009 | Eldar et al. |
| 7,652,608 | B1 | 1/2010 | Mathis et al. |
| 7,751,469 | B2 | 7/2010 | Eldar et al. |

(Continued)

FOREIGN PATENT DOCUMENTS

WO 2012049591 A1 4/2012

OTHER PUBLICATIONS

Lin et al., "Periodically nonuniform sampling of bandpass signals", IEEE Transactions on Circuits & Systems—II: Analog & Digital Signal Processing, vol. 45, No. 3, pp. 340-351, Mar. 1998.

(Continued)

*Primary Examiner* — Khai M Nguyen
(74) *Attorney, Agent, or Firm* — D. Kligler IP Services Ltd.

(57) ABSTRACT

A method includes accepting an analog input signal including a sequence of pulses of a given pulse shape. The analog input signal is distributed to multiple processing channels (40) operating in parallel. The analog input signal is sampled by performing, in each of the multiple processing channels, the operations of: mixing the analog input signal with a different, respective modulating waveform to produce a mixed signal; filtering the mixed signal; and digitizing the filtered mixed signal to produce a respective digital channel output.

38 Claims, 4 Drawing Sheets

(56) References Cited

U.S. PATENT DOCUMENTS

| | | | |
|---|---|---|---|
| 7,888,900 | B2 | 2/2011 | Okamoto et al. |
| 8,032,085 | B2 | 10/2011 | Mishali et al. |
| 8,457,579 | B2 * | 6/2013 | Mishali et al. ............... 455/207 |
| 2002/0003843 | A1 | 1/2002 | Maritone |
| 2004/0264634 | A1 | 12/2004 | Claus et al. |
| 2005/0141603 | A1 | 6/2005 | Miller |
| 2005/0179585 | A1 | 8/2005 | Walker et al. |
| 2006/0009225 | A1 | 1/2006 | Herre et al. |
| 2006/0013597 | A1 | 1/2006 | Crivelli et al. |
| 2006/0217082 | A1 | 9/2006 | Fischer |
| 2008/0129560 | A1 | 6/2008 | Baraniuk et al. |
| 2008/0221711 | A1 | 9/2008 | Trainer |
| 2009/0190689 | A1 | 7/2009 | Blu et al. |
| 2010/0010351 | A1 | 1/2010 | Jovanovic et al. |
| 2010/0178057 | A1 | 7/2010 | Shieh |
| 2011/0225218 | A1 | 9/2011 | Eldar et al. |
| 2011/0294453 | A1 | 12/2011 | Mishali et al. |
| 2012/0068867 | A1 | 3/2012 | Pagnanelli |

OTHER PUBLICATIONS

Tian et al., "Compressed sensing for wideband cognitive radios", IEEE Conference on Acoustics, Speech & Signal Processing, vol. 4, pp. IV1357-IV1360, Honolulu, USA, Apr. 15-20, 2007.

Davis et al., "Adaptive Greedy Approximations", Journal on Constructive Approximation, vol. 13, No. 1, pp. 57-98, year 1997.

Candes et al., "Decoding by Linear Programming", IEEE Transactions on Information Theory, vol. 51, No. 12, pp. 4203-4215, Dec. 2005.

Kruskal, J.B., "Three-way Arrays: rank and uniqueness of trilinear decompositions, with application to arithmetic complexity and statistics", Linear Algebra and its Applications, vol. 18, issue 2, pp. 95-138, year 1977.

Mondillo et al., "Handheld echocardiography: its use and usefulness", International Journal of cardiology, vol. 111, No. 1, pp. 1-5, year 2006.

Tropp et al., "Random Filters for Compressive Sampling and Reconstruction", IEEE International Conference on Acoustics, Speech and Signal Processing, pp. III872-III875, Toulouse, France, May 2006.

Unser et al., "A General Sampling Theory for Nonideal Acquisition Devices", IEEE Transactions on Signal Processing, vol. 42, No. 11, pp. 2915-2925, Nov. 1994.

Aldroubi et al., "Nonuniform Sampling and Reconstruction in Shift-Invariant Spaces", SIAM Journal, vol. 43, issue 4, pp. 585-620, Mar. 2001.

Eldar et al., "Nonideal Sampling and Interpolation From Noisy Observations in Shift-Invariant Spaces", IEEE Transactions on Signal Processing, vol. 54, No. 7, pp. 2636-2651, Jul. 2006.

Hou et al., "A new method for high resolution estimation of time delay", IEEE International Conference on Acoustics, Speech and Signal Processing, vol. 7, pp. 420-423, May 1982.

Senior et al., "Portable echocardiography: a review", British Journal of cardiology, vol. 13, No. 3, pp. 185-189, May/Jun. 2006.

Bienvenu et al., "Adaptivity to background noise spatial coherence for high resolution passive methods", IEEE International Conferences on Acoustics, Speech and Signal Processing, vol. 05, pp. 307-310, Apr. 1980.

Unser, M., "Splines: A Perfect Fit for Signal and Image Processing", IEEE Signal Processing Magazine, vol. 16, No. 6, pp. 22-38, Nov. 1999.

Unser et al., "Cardinal Exponential Splines: Part I—Theory and Filtering Algorithms", IEEE Transactions on Signal Processing, vol. 53,No. 4, pp. 1425-1438, Apr. 2005.

Maravic et al., "Sampling and reconstructions of signals with finite rate of innovation in the presence of noise", IEEE Transactions on Signal Processing, vol. 53, No. 8, pp. 2788-2805, Aug. 2005.

Kusuma et al., "Multichannel Sampling of Parametric Signals with a Successive Approximation Property", IEEE International Conference in Image Processing, pp. 1265-1268, Oct. 2006.

Shan et al., "On Spatial Smoothing for direction-of-arrival estimation of coherent signals", IEEE Transactions on Acoustics, Speech and Signal Processing, vol. 33, No. 4, pp. 806-811, Aug. 1985.

Bresler et al., "Spectrum-blind minimum rate sampling and reconstruction of 2-D multi-band signals", IEEE International Conference on Image Processing, vol. 1, pp. 701-704, Switzerland, Sep. 1996.

Benedetto et al., "Gabor Systems and the balian-low theorem", Gabor Analysis and Algorithms: Theory and Applications, pp. 85-122, year 1998.

Feichtinger et al., "A Banach space of test functions for gabor analysis", Gabor Analysis and Algorithms: Theory and Applications, p. 123-170, year 1998.

Daubechies et al., "Painless nonorthogonal expansions", Journal of Mathematical Physics, vol. 27, No. 5, pp. 1271-1283, May 1986.

Christensen et al., "Pairs of dual gabor frame generators with compact support and desired frequency localization", Applied and Computational Harmonic Analysis, vol. 20, No. 3, pp. 403-410, May 2006.

Candes et al., "Near Optimal Signal Recovery from random projections: universal encoding strategies?", IEEE information Theory, vol. 52, No. 12, pp. 5406-5425, Dec. 2006.

Rudelson et al., "On Sparse Reconstruction from Fourier and Gaussian Measurements", Communications on Pure and Applied Mathematics, vol. 61, issue 8, pp. 1025-1045, year 2008.

Ron et al., "Frames and stable bases for shift-invariant subspaces of L2(Rd)", Canadian Journal of Mathematics, vol. 47, No. 5, pp. 1051-1094, year 1995.

Prete, V.D., "Estimates, decay properties, and computation of the dual function for gabor frames", Journal of Fourier Analysis and Applications, vol. 5, issue 6, pp. 545-562, year 1999.

Grochenig et al., "Note on b-slines, wavelet scaling functions, and gabor games", IEEE Transactions on Information Theory, vol. 49, No. 12, pp. 3318-3320, Dec. 2003.

Folland et al., "The uncertainty principle: a mathematical survey", Journal of Fourier Analysis and Applications, vol. 3, No. 3, pp. 207-238, year 1997.

Butzer et al., "A sampling theorem for duration-limited functions with error estimates", Information and Control, vol. 34, issue 1, pp. 55-65, May 1977.

Butzer et al., "Sampling theory for not necessarily band-limited functions: A historical overview", SIAM review, vol. 34, No. 1, pp. 40-53, Mar. 1992.

Grochenig, K., "Foundations of Time-Frequency Analysis", chapter 3.1 (pp. 36-41) and chapter 5.2 (pp. 92-97, year 2001.

Dragotti et al., "Sampling moments and reconstructing signals of finite rate of innovation: Shannon meets strang-fix", IEEE Transactions on Signal Processing, vol. 55, No. 5, pp. 1741-1757, May 2007.

Hua et al., "Matrix pencil method for estimating parameters of exponentially damped/undamped sinusoids in noise", IEEE Transactions on Acoustics, Speech and Signal Processing, vol. 38, No. 5, pp. 814-824, May 1990.

Kumaresan et al., "Estimating the angles of arrival of multiple plane waves", IEEE Transactions on Aerospace Electronic System, vol. AES19, No. 1, pp. 134-139, Jan. 1983.

Roy et al., "ESPRIT—estimation of signal parameters via rotational invariance techniques", IEEE Transactions on Acoustics, Speech and Signal Processing, vol. 37, No. 7, pp. 984-995, Jul. 1989.

Schmidt, E., "Multiple emitter location and signal parameter estimation", IEEE Transactions on Antennas & Propagation, vol. AP-34, No. 3, pp. 276-280, Mar. 1986.

International Application PCT/IB2010/050661 Search Report dated Jul. 15, 2010.

U.S. Appl. No. 13/144,086 Office Action dated Nov. 28, 2012.

Chen et al., "Modulated Wideband Converter with Non-Ideal Lowpass Filters", 2010 IEEE International Conference on Acoustics Speech and Signal Processing (ICASSP), pp. 3630-3633, Dallas, USA, Mar. 14-19, 2010.

EP Application # 11156901.8 Extended Search Report dated Jul. 6, 2011.

Mishali et al., "Spectrum-blind reconstruction of multi-band signals", IEEE International Conference on Acoustics, Speech and Signal Processing, pp. 3365-3368, Las Vegas, USA, Mar. 31-Apr. 4, 2008.

(56) References Cited

OTHER PUBLICATIONS

"Cascaded 2-Tone, 3rd-Order Compression Point (IP3)", RF Cafe Website, downloaded from http://www.rfcafe.com/references/electrical/ip3.htm on Apr. 19, 2010.

Mishali et al., "Reduce and Boost: Recovering Arbitrary Sets of Jointly Sparse Vectors", IEEE Transactions on Signal Processing, vol. 56, No. 10, pp. 4692-4702, Oct. 2008.

Mishali et al., "Xampling—Part I: Practice", arXiv:0911.0519v1, Nov. 3, 2009.

Mishali et al., "The modulated wideband converter: online documentation and simulations", Jul. 10, 2009 (http://webee.technion.ac.il/Sites/People/YoninaEldar/Info/software/GUI/MWC_GUI.htm).

Calderbank et al., "Compressed Learning: Universal Sparse Dimensionality Reduction and Learning in the Measurement Domain", Feb. 13, 2009.

Candes, E. J., "The Restricted Isometry Property and Its Implications for Compressed Sensing", Feb. 27, 2008.

El-Chammas et al., "General Analysis on the Impact of Phase-Skew in Time-Interleaved ADCs", IEEE Transactions on Circuits and Systems—I: Regular papers, vol. 56, No. 5, pp. 902-910, May 2009.

National Semiconductor Corporation, "A/D Converter—Definition of terms", Jan. 2000.

Tropp, J.A., "Algorithms for simultaneous spare approximation. Part II: Convex relaxation", Special Issue on Sparse Approximations in Signal and Image Processing, vol. 86, issue 3, pp. 589-602, Mar. 2006.

"Wireless LAN Medium Access Control (MAC) and Physical Layer (PHY) specifications: High-speed physical layer in the 5 GHz band," IEEE Standard 802.11a, year 1999.

Zverev, A.I. "Handbook of Filter Synthesis", p. 13, John Wily & Sons 1967.

Viterbi, A.J., "CDMA principles of spread spectrum communication," Addison-Wesly Wireless Communications Series, 1995.

Kohlenberg, A., "Exact interpolation of band-limited functions", Journal of Applied Physics, vol. 24, No. 12, pp. 1432-1435, Dec. 1953.

Dickson et al., "An 80-Gb/s 231—1 pseudorandom binary sequence generator in SiGe BiCMOS technology", IEEE Journal on Solid-State Circuits, vol. 40, No. 12, pp. 2735-2745, Dec. 2005.

Razavi, B., "A 60-GHz CMOS receiver front-end", IEEE Journal of Solid-State Circuits, vol. 41, No. 1, pp. 17-22, Jan. 2006.

Shannon, C.E., "Communication in the presence of noise", Proceeding of IRE, vol. 86, No. 2, pp. 447-457, Feb. 1998 (reprinted from IRE proceedings vol. 37, pp. 10-21, 1949).

Hedge et al., "Random projections for manifold learning", Advances in Neural Information Processing Systems 20, pp. 641-648, year 2008.

Herley et al., "Minimum rate sampling and reconstruction of signals with arbitrary frequency support", IEEE Transactions on Information Theory, vol. 45, No. 5, pp. 1555-1564, Jul. 1999.

Kienmayer et al., "A low-power low-voltage NMOS bulk-mixer with 20 GHz bandwidth in 90 nm CMOS", Proceedings of the 2004 International Symposium on Circuits and Systems, vol. 4, Vancouver, Canada, May 23-26, 2004.

Wang et al., "A background timing-skew calibration technique for time-interleaved analog-to-digital converters", IEEE Transactions on Circuits & Systems—II: Express Briefs, vol. 53, No. 4, pp. 299-303, Apr. 2006.

Donoho et al., "Optimally sparse representation in general (nonorthogonal) dictionaries via I1 minimization", Proceedings of the National Academy of Science of USA, vol. 100, No. 4, pp. 2197-2202, Mar. 4, 2003.

Elbornsson et al., "Blind equalization of time errors in a time-interleaved ADC system", IEEE Transactions on Signal Processing, vol. 53, No. 4, pp. 1413-1424, Apr. 2005.

Laska et al., "Theory and implementation of an analog-to-information converter using random demodulation", IEEE Proceedings of International Symposium on Circuits and Systems, pp. 1959-1962, New Orleans, USA, May 27-30, 2007.

Le et al., "Analog-to-digital converters", IEEE Signal Processing Magazine, vol. 22, No. 6, pp. 69-77, Nov. 2005.

Cotter et al., "Sparse solutions to linear inverse problems with multiple measurement vectors", IEEE Transactions on Signal Processing, vol. 53, No. 7, pp. 2477-2488, Jul. 2005.

Venkataramani et al., "Perfect reconstruction formulas and bounds on aliasing error in sub-Nyquist nonuniform sampling of multiband signals", IEEE Transactions on Information Theory, vol. 46, No. 6, pp. 2173-2183, Sep. 2000.

Unser, M., "Sampling—50 years after Shannon", Proceedings of the IEEE, vol. 88, No. 4, pp. 569-587, Apr. 2000.

Vetterli et al., "Sampling signals with finite rate of innovation", IEEE Transactions on Signal Processing, vol. 50, No. 6, pp. 1417-1428, Jun. 2002.

Mitoja, J., "Cognitive radio for flexible mobile multimedia communications", Mobile Networks and Applications, vol. 6, issue 5, pp. 435-441, Sep. 2001.

Alon et al., "Simple constructions of almost k-wise independent random variables", Proceedings of the 31st Annual Symposium on Foundations of Computer Science, vol. 2, pp. 554-553, St. Louis, USA, Oct. 22-24, 1990.

Carvalho et al., "Compact formulas to relate ACPR and NPR to two-tone IMR and IP3", Microwave Journal, vol. 42, No. 12, Dec. 1999.

Boutin et al., "An arctangent type wideband PM/FM demodulator with improved performances", Proceedings of the 33rd Midwest Symposium on Circuits and Systems, pp. 460-463, Calgary, Canada, Aug. 12-14, 1990.

Donoho, D.L., "Compressed sensing", IEEE Transactions on Information Theory, vol. 52, issue 4, pp. 1289-1306, Apr. 2006.

Candes et al., "Robust uncertainty principles: Exact signal reconstruction from highly incomplete frequency information", IEEE Transactions on Information Theory, vol. 52, No. 2, pp. 489-509, Feb. 2006.

Laskin et al., "A 60 mW per Lane, 4 × 23-Gb/s 27-1 PRBS Generator", IEEE Journal on Solid-State Circuits, vol. 41, No. 10, pp. 2198-2208, Oct. 2006.

Gardner, F., "Properties of frequency difference detectors", IEEE Transactions on Communications, vol. 33, No. 2, pp. 131-138, Feb. 1985.

Landau, H.J., "Necessary density conditions for sampling and interpolation of certain entire functions", Acta Mathematica, vol. 177, No. 1, pp. 37-52, Feb. 1967.

Johansson et al., "Reconstruction of nonuniformly sampled bandlimited signals by means of digital fractional delay filters", IEEE Transactions on Signal Processing, vol. 50, No. 11, pp. 2757-2767, Nov. 2002.

Nyquist, H., "Certain Topics in Telegraph Transmission Theory", Proceedings of the IEEE, vol. 90, No. 2, pp. 280-305, Feb. 2002 (reprinted from Transactions of A.I.E.E, vol. 47, No. 2, pp. 617-644, Apr. 1928).

Friis, H. T., "Noise figures of radio receivers", Proceedings of the IRE, vol. 32, No. 7, pp. 419-422, Jul. 1944.

Tropp, J. A., "Algorithms for simultaneous spare approximation. Part I: Greedy pursuit", Special Issue on Sparse Approximations in Signal and Image Processing, vol. 86, pp. 572-588, Apr. 2006.

Chen et al., "Theoretical results on sparse representations of multiple-measurement vectors", IEEE Transactions on Signal Processing, vol. 54, No. 12, pp. 4634-4643, Dec. 2006.

Crols et al., "Low-IF topologies for high-performance analog front ends of fully integrated receivers", IEEE Transactions on Circuits & Systems—I: Analog and Digital Signal Processing, vol. 45, No. 3, pp. 269-282, Mar. 1998.

Feng et al., "Spectrum-blind minimum-rate sampling and reconstruction of multiband signals", Proceedings of IEEE International Conference on ASSP, vol. 2, pp. 1688-1691, May 1996

Vaidyanathan et al., "Generalizations of the sampling theorem: Seven decades after Nyquist", IEEE Transactions on Circuits & Systems—I: Fundamental Theory and Applications, vol. 48, No. 9, pp. 1094-1109, Sep. 2001

(56) References Cited

OTHER PUBLICATIONS

Welch et al., "The use of fast Fourier transform for the estimation of power spectra: A method based on time averaging over short, modified periodograms", IEEE Transactions on Audio and Electroacoustics, vol. 15, No. 2, pp. 70-73, Jun. 1967.
Baraniuk et al., "A simple proof of the restricted isometry property for random matrices," Constructive Approximation, Feb. 5, 2007.
Chen et al., "Atomic decomposition by basis pursuit", SIAM Review, vol. 43, No. 1, pp. 129-159, year 2001 (published originally in SIAM Journal on Scientific Computing, vol. 20, No. 1, pp. 33-61, Aug. 1998).
Huang et al., "Blind calibration of timing offsets for four-channel time-interleaved ADCs", IEEE Transactions on Circuits & Systems—I: Regular papers, vol. 54, No. 4, pp. 863-876, Apr. 2007.
Vaughan et al., "The theory of Bandpass Sampling", IEEE Transactions on Signal Processing, vol. 39, No. 9, pp. 1973-1984, Sep. 1991.
Walden, R.H., "Analog-to-digital converter survey and analysis", IEEE Journal on Selected Areas in Communication, vol. 17, No. 4, pp. 539-550, Apr. 1999.
Pickoltz et al., "Theory of Spread-Spectrum Communications—A Tutorial", IEEE Transactions on Communications, vol. 30, No. 5, pp. 855-884, May 1982.
Kotelnikov, V.A., "On the transmission capacity of 'ether' and wire in electrocommunications", Proceedings of the first All-Union Conference on the technological reconstruction of the communications sector and the development of low-current engineering, Moscow, Russia, 1933.
Black et al., "Time interleaved converter arrays", IEEE International Conference on Solid-State Circuits, vol. XXIII, pp. 14-15 & 254, Feb. 13, 1980.
Eldar et al., "Filter bank reconstruction of bandlimited signals from nonuniform and generalized samples," IEEE Transactions on Signal Processing, vol. 48, No. 10, pp. 2864-2875, Oct. 2000.
Eldar et al., "A minimum squared-error framework for generalized sampling", IEEE Transactions on Signal Processing, vol. 54, No. 6, pp. 2155-2167, Jun. 2006.
Jeng, Y.C., "Digital spectra of nonuniformly sampled signals: a robust sampling time offset estimation algorithm for ultra high-speed waveform digitizers using interleaving", IEEE Transactions on Instrumentation & Measurement, vol. 39, No. 1, pp. 71-75, Feb. 1990.
Chen et al., "A Sub-Nyquist Rate Sampling Receiver Exploiting Compressive Sensing", IEEE Transactions on Circuits and Systems—I: Regular papers, vol. 58, No. 3, pp. 507-520, Mar. 2011.
European Application # 08808014.8 Examination Report dated Apr. 19, 2010, 17 pages.
Venkataramani et al., "Further results on spectrum blind sampling of 2D signals", Proceedings of the 1998 International Conference on Image Processing (ICIP), vol. 2, pp. 752-756, Oct. 4, 1998.
Rauhut et al., "Average Case Analysis of Multichannel Basis Pursuit", 8th international conference on Sampling Theory and Applications, Marseille, France, May 18-22, 2009.
Eldar et al., "Robust Recovery of Signals From a Structured Union of Subspaces", IEEE Transactions on Information Theory, vol. 55, issue 11, pp. 5302-5316, Nov. 2009.
Fleyer et al., "Multirate Synchronous Sampling of Sparse Multiband Signals", arXiv:0806.0579v1 [cs.IT], Jun. 3, 2008.
Fudge et al., "A Nyquist Folding Analog-to Information Receiver" , 42nd Asilomar Conference on Signals, Systems and Computers, pp. 541-545, Pacific Grove, USA, Oct. 26-29, 2008.
Gedalyahu et al., "Low Rate Sampling Schemes for Time Delay Estimation", arXiv:0905.2429v1 [cs.IT], May 14, 2009.
Gentile, K., "Introduction to Zero-Delay Clock Timing Techniques", Analog Device Application Note AN-0983, Rev.0, year 2008.
Li et al., "Quickest Spectrum Sensing in Cognitive Radio", 42nd Annual Conference on Information Sciences and Systems, pp. 203-208, Princeton, USA, Mar. 19-21, 2008.
Lu et al., "A Theory for Sampling Signals from a Union of Subspaces", IEEE Transactions on Signal Processing, vol. 56, issue 6, pp. 2334-2345, Jun. 2008.

Maxim Integrated Products, "Data Converters", year 2008.
Mini-Circuits, "Understanding VCO Concepts", Application Note AN-95-007, Revision , Aug. 21, 2009.
Mishali et al., "Blind Multiband Signal Reconstruction: Compressed Sensing for Analog Signals", IEEE Transactions on Signal Processing, vol. 57, No. 3, pp. 993-1009, Mar. 2009.
Mishali et al., "Expected RIP: Conditioning of the Modulated Wideband Converter", IEEE Information Theory Workshop, pp. 343-347, Taormina, Italy, Oct. 11-16, 2009.
Mishali et al., "From Theory to Practice: Sub-Nyquist Sampling of Sparse Wideband Analog Signals", arXiv:0902.4291v3 [cs.IT], Feb. 25, 2009.
Polo et al., "Compressive Wide-Band Spectrum Sensing", IEEE International Conference on Acoustics, Speech and Signal Processing, pp. 2337-2340, Taipei, Taiwan, Apr. 19-24, 2009.
Polo, Y.L., "Compressive Wideband Spectrum Sensing for Cognitive Radio Applications", Master of Science Thesis, Delft University of Technology, Nov. 28, 2008.
Ragheb et al., "A Prototype Hardware for Random Demodulation Based Compressive Analog-to-Digital Conversion", 51st Midwest Symposium on Circuits and Systems, pp. 37-40, Knoxville, USA, Aug. 10-13, 2008.
Texas Instruments Incorporated, "Data Converters", years 1995-2010.
Tropp et al., "Beyond Nyquist: Efficient Sampling of Sparse Bandlimited Signals", arXiv:0902.0026v2 [cs.IT], Jan. 31, 2009.
Tsai et al., "Correction of Mismatches in a Time-Interleaved Analog-to-Digital Converter in an Adaptively Equalized Digital Communication Receiver", IEEE Transactions on Circuits and Systems—I: Regular Papers, vol. 56, No. 2, pp. 307-319, Feb. 2009.
Wakin, M.B., "A Manifold Lifting Algorithm for Multi-View Compressive Imaging", Picture Coding Symposium, pp. 1-4, Chicago, USA, May 6-8, 2009.
Eldar et al., "Beyond Bandlimited Sampling", IEEE Signal Processing Magazine, vol. 26, issue 3, pp. 48-68, May 2009.
Eldar, Y., "Compressed Sensing of Analog Signals in Shift-Invariant Spaces", IEEE Transactions on Signal Processing, vol. 57, No. 8, pp. 2986-2997, Aug. 2009.
Eldar, Y., "Uncertainty Relations for Shift-Invariant Analog Signals", IEEE Transactions on Signal Processing, vol. 55, No. 12, pp. 5742-5757, Dec. 2009.
Yu et al., "Mixed-Signal Parallel Compressed Sensing and Reception for Cognitive Radio", IEEE International Conference on Acoustics, Speech and Signal Processing, pp. 3861-3864, Las Vegas, USA, Mar. 31-Apr. 4, 2008.
Zhang et al., "Compressive Sensing Based Ultra-wideband Communication System", IEEE International Conference on Communications, pp. 1-5, Dresden, Germany, Jun. 14-18, 2009.
Camarero et al., "Mixed Signal Clock-Skew Calibrator for Time Interleaved Analog-to-Digital Converters", IEEE Transactions on Circuits and Systems—I: Regular papers, vol. 55, No. 11, pp. 3676-3687, Dec. 2008.
Mendelson et al., "Uniform Uncertainty Principle for Bernouilli and Subgaussian Ensembles", arXiv: math/0608665v1, Aug. 27, 2006.
Laugesen, R.S., "Gabor Dual Spline Windows", Jun. 23, 2008.
Christensen et al., "Gabor windows supported on [−1,1] and compactly supported dual windows", BK21 Research Report, Jun. 24, 2009.
Prete, V., "On a Necessary Condition for B-Spline Gabor Frames", Ricerche di matematica, vol. 59, No. 1, pp. 161-164, Mar. 12, 2010.
Michaeli et al., "Optimization techniques in modern sampling theory", Convex Optimization in Signal Processing and Communications, Cambridge University Press, Mar. 16, 2009.
Ramani et al., "Nonideal Sampling and Regularization Theory", IEEE Transactions on Signal Processing, vol. 56, No. 3, pp. 1055-1070, Mar. 2008.
Blu et al., "Sparse sampling of signal innovations", IEEE Signal Processing Magazine, vol. 25, No. 2, pp. 31-40, Mar. 2008.
Tur et al., "Low Rate Sampling of Pulse Streams with Application to Ultrasound Imaging", arXiv:1003.2822v3 [cs.IT], Mar. 14, 2010.
Matusiak et al., "Sub-Nyquist Sampling of Short Pulses: Part I", arXiv:1010.3132v1 [cs.IT], Oct. 15, 2010.

(56) References Cited

OTHER PUBLICATIONS

Akhoundi Asl et al., "Multichannel Sampling of Signals with Finite Rate of Innovation", IEEE Signal Processing Letters, vol. 17, No. 08, pp. 762-765, Aug. 2010.
Seelamantula et al., "A Generalized Sampling Method for Finite-Rate-of-Innovation-Signal Reconstruction", IEEE Signal Processing Letters, vol. 15, pp. 813-816, year 2008.
Olkkonen et al., "Measurement and Reconstruction of Impulse Train by Parallel Exponential Filters", IEEE Signal Processing Letters, vol. 15, pp. 241-244, year 2008.
Gedalyahu et al., "Time-Delay Estimation From Low-Rate Samples: A Union of Subspaces Approach", IEEE Transactions on Signal Processing, vol. 58, No. 6, pp. 3017-3031, Jun. 2010.
Mishali et al., "Xampling: Signal Acquisition and Processing in Union of Subspaces", arXiv:0911.0519v2 [cs.IT], Sep. 25, 2010.
Mishali et al., "Xampling: analog to digital at sub-Nyquist rates", arXiv:0912.2495v1, Dec. 13, 2009.
Bajwa et al., "Identification of Underspread Linear Systems with Application to Super-Resolution Radar", arXiv:1008.0851v1 [cs.IT], Aug. 4, 2010.
Eldar et al., "Recovering Signals From Lowpass Data", arXiv:0907.3576v1, Jul. 21, 2009.
International Application PCT/IB2011/051449 Search Report dated Nov. 14, 2011.
International Application PCT/IB2011/054384 Search Report dated Feb. 17, 2012.
Candes et al., "Compressed Sensing with Coherent and Redundant Dictionaries", May 14, 2010.
Mishali et al., "From Theory to Practice: Sub-Nyquist Sampling of Sparse Wideband Analog Signals", IEEE Journal of Selected Topics in Signal Processing, vol. 4, No. 2, pp. 375-391, Apr. 2010.
Smith et al., "Compressed Sampling for Pulse Doppler Radar", IEEE Radar Conference, pp. 887-892, May 10, 2010.
Pfander et al., "Sparsity in Time Frequency Representations", Journal of Fourier Analysis and Applications, vol. 16, No. 2, pp. 233-260, Aug. 4, 2009.
Matusiak et al., "Sub-Nyquist Sampling of Short Pulses: Theory", Apr. 11, 2011.
U.S. Appl. No. 13/824,369 Office Action dated Feb. 13, 2014.
U.S. Appl. No. 13/041,455 Office Action dated Jan. 15, 2014.

* cited by examiner

MULTI-CHANNEL SAMPLING OF PULSE STREAMS AT THE RATE OF INNOVATION

CROSS-REFERENCE TO RELATED APPLICATIONS

This application claims the benefit of U.S. Provisional Patent Application 61/328,228, filed Apr. 27, 2010, whose disclosure is incorporated herein by reference.

FIELD OF THE INVENTION

The present invention relates generally to signal sampling, and particularly to methods and systems for sampling pulse streams.

BACKGROUND OF THE INVENTION

Sampling of analog signals in order to enable digital signal processing is used in a wide variety of applications and for various signal types. Numerous sampling schemes are known in the art, some of which attempt to reduce the sampling rate while ensuring that the digital samples represent the analog signal with high accuracy. The well-known Shannon-Nyquist theorem, for example, states that a general band-limited signal should be sampled at twice its highest frequency in order to enable perfect reconstruction.

Some sampling schemes attempt to exploit certain signal characteristics in order to reduce the sampling rate below the Nyquist rate. For example, some analog signals can be characterized as having a finite number of degrees of freedom per unit time, also referred to as a Finite Rate of Innovation (FRI). One example of an FRI signal is a stream of analog pulses. Reception and reconstruction of analog pulse sequences are performed, for example, in ultrasound imaging and other medical imaging, processing of neuronal signals, image processing, radar systems and Ultra-Wideband (UWB) communication.

Example schemes for sampling FRI signals such as pulse sequences have been proposed by Vetterly et al., in "Sampling Signals with Finite Rate of Innovation," IEEE Transactions on Signal Processing, volume 50, no. 6, June, 2002, pages 1417-1428; and by Blu et al., in "Sparse Sampling of Signal Innovations," IEEE Signal Processing Magazine, volume 25, no. 2, March, 2008, pages 31-40, which are incorporated herein by reference.

Other examples of sampling FRI signals are described by Maravic and Vetterli, in "Sampling and Reconstruction of Signals with Finite Rate of Innovation in the Presence of Noise," IEEE Transactions on Signal Processing, volume 53, no. 8, August, 2005, pages 2788-2805; by Dragotti et al., in "Sampling Moments and Reconstructing Signals of Finite Rate of Innovation: Shannon Meets Strang-Fix," IEEE Transactions on Signal Processing, volume 55, no. 5, May, 2007, pages 1741-1757; and by Seelamantule and Unser, in "A Generalized Sampling Method for Finite-Rate-of-Innovation-Signal Reconstruction," IEEE Signal Processing Letters, volume 15, 2008, pages 813-816, which are all incorporated herein by reference.

Some signal sampling schemes use multi-channel configurations. Multi-channel sampling schemes are described, for example, by Kusuma and Goyal, in "Multichannel Sampling of Parametric Signals with a Successive Approximation Property," IEEE International Conference on Image Processing, Atlanta, Ga., October, 2006, pages 1265-1268; and by Olkkonen and Olkkonen, in "Measurement and Reconstruction of Impulse train by Parallel Exponential Filters," IEEE Signal Processing Letters, volume 15, 2008, pages 241-244, which are incorporated herein by reference.

SUMMARY OF THE INVENTION

An embodiment of the present invention that is described herein provides a method including accepting an analog input signal including a sequence of pulses of a given pulse shape. The analog input signal is distributed to multiple processing channels operating in parallel. The analog input signal is sampled by performing, in each of the multiple processing channels, the operations of: mixing the analog input signal with a different, respective modulating waveform to produce a mixed signal; filtering the mixed signal; and digitizing the filtered mixed signal to produce a respective digital channel output.

In some embodiments, filtering the mixed signal includes integrating the mixed signal over time. In an embodiment, the sequence of the pulses has a given rate of innovation, defined as a given number of degrees of freedom per unit time, and sampling the analog input signal includes digitizing the filtered mixed signal at an aggregate sampling rate, aggregated over the multiple processing channels, that is equivalent to the rate of innovation. In a disclosed embodiment, each modulating waveform includes a different, respective complex sinusoid. In another embodiment, each modulating waveform includes a different, respective weighted sum of complex sinusoids.

In some embodiments, the method includes generating each modulating waveform by filtering a respective periodic waveform using a respective shaping filter. The periodic waveform may include a train of rectangular pulses. In an embodiment, the method includes generating multiple different cyclic shifts of a base waveform, and using the cyclic shifts as respective periodic waveforms for the multiple processing channels.

In some embodiments, the method includes reconstructing the analog input signal from multiple digital channel outputs produced by the multiple processing channels. Reconstructing the analog input signal may include recovering respective time positions and respective amplitudes of the pulses in the sequence. Reconstructing the analog input signal may include, upon a failure in a subset of the processing channels, reconstructing the analog input signal from the digital channel outputs of the processing channels other than the subset.

In an embodiment, reconstructing the analog input signal includes compensating for relative time delays among the processing channels. In another embodiment, accepting the analog input signal includes receiving multiple ultrasound echo pulses that are reflected from tissue, and reconstructing the analog input signal includes outputting respective amplitudes and time positions of the echo pulses so as to diagnose the tissue. In yet another embodiment, accepting the analog input signal includes receiving multiple reflections of a radar signal, and reconstructing the analog input signal includes outputting respective amplitudes and the time positions of the reflections.

In some embodiments, the sequence of the pulses is confined to a finite time interval. In other embodiments, the sequence of the pulses is infinite. In an embodiment, the sequence of the pulses is made up of successive periods, each period containing L pulses having L respective time positions within the period that do not vary from one period to another, and the method includes reconstructing the analog input signal from multiple digital channel outputs produced by the multiple processing channels by estimating the L time positions jointly over two or more of the periods. Reconstructing the analog input signal may include, when respective amplitudes of the pulses vary from one period to another by more than a given amount, recovering the analog input signal using L+1 processing channels.

In some embodiments, accepting the analog input signal includes receiving at least one signal type selected from a group of types consisting of an ultrasound signal, a communication signal, a radar signal, a biological signal and an image signal, which carries the sequence of the pulses.

There is additionally provided, in accordance with an embodiment of the present invention, apparatus including an input interface and a sampling unit. The input interface is configured to accept an analog input signal including a sequence of pulses of a given pulse shape. The sampling unit includes multiple processing channels that operate in parallel to one another, each of which processing channels is configured to sample the analog input signal by mixing the analog input signal with a different, respective modulating waveform to produce a mixed signal, filtering the mixed signal, and digitizing the filtered mixed signal to produce a respective digital channel output.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for sampling sequences of analog pulses in an analog input signal. The pulses in the signal typically have a known pulse shape but unknown amplitudes and time positions. A sampling and reconstruction system samples the analog input signal using multiple processing channels operating in parallel.

Typically, each processing channel mixes the analog input signal with a respective modulating waveform, integrates or otherwise filters the mixed signal over time, and then digitizes the result. With proper choice of modulation waveforms, the system is able to reconstruct the analog input signal (e.g., recover the time positions and amplitudes of the individual pulses) from the outputs of the multiple processing channels.

Several examples of multi-channel sampling schemes and modulating waveforms are described herein. In some embodiments the modulating waveforms comprise complex sinusoids or weighted sums of complex sinusoids. In other embodiments, the modulating waveforms comprise digitally-generated sequences of rectangular pulses that are pulse-shaped prior to mixing with the analog input signal. Example techniques for generating such waveforms, as well as related design considerations, are provided hereinbelow. The disclosed sampling and reconstruction schemes are applicable to both finite and infinite pulse sequences.

The disclosed multi-channel configurations sample sequences of pulses of an arbitrary pulse shape at very low sampling rates, without compromising the ability to reconstruct the signal with high accuracy. In some embodiments, the sampling rate, aggregated over the multiple processing channels, is equivalent to the rate of innovation of the input signal. In some embodiments, the disclosed multi-channel configurations can overcome failure of one or more processing channels by recovering the input signal reliably from the outputs of the remaining channels. Unlike some known sampling schemes, the disclosed techniques are numerically stable and resilient to noise. Example simulated test results of the disclosed techniques can be found in U.S. Provisional Patent Application 61/328,228, cited above.

The methods and systems described herein can be used in various applications that involve processing of analog pulses, such as, for example, ultrasound imaging or other types of medical imaging, processing of radar signals and processing of communication signals.

System Description

Embodiments of the present invention sample and reconstruct sequences of analog pulses. The pulses in the sequence are typically of a known pulse shape but unknown amplitudes and time positions. This type of signals is sometimes referred to as having a Finite Rate of Innovation (FRI), since they have a finite number of degrees of freedom per unit time.

Figure 1:
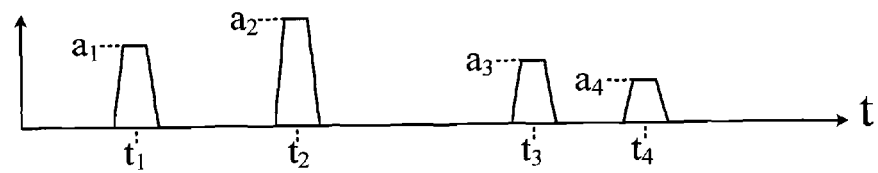
FIG. 1 is a graph showing an input signal comprising a sequence of analog pulses, which is sampled in accordance with an embodiment of the present invention.

FIG. 1 is a graph showing an input signal comprising a sequence of analog pulses. Input signals of this sort are sampled and reconstructed using the disclosed techniques. The present example shows four pulses of the same known pulse shape. The four pulses have amplitudes $a_1 \ldots a_4$ and respective time positions $t_1 \ldots t_4$.

Figure 2:
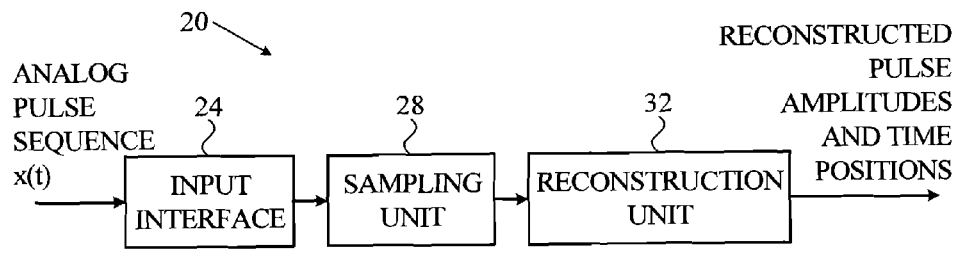
FIG. 2 is a block diagram that schematically illustrates a system for sampling and reconstruction of analog pulse sequences, in accordance with an embodiment of the present invention.

FIG. 2 is a block diagram that schematically illustrates a system 20 for sampling and reconstruction of analog pulse sequences, in accordance with an embodiment of the present invention. System 20 may be used in any suitable application that involves processing of analog pulse sequences. Example applications include ultrasound imaging and other bio-imaging modalities, processing of neuronal signals or other biological signals, processing of radar signals, image processing and Ultra-Wideband (UWB) communication.

System 20 comprises an input interface 24, a sampling unit 28 and a reconstruction unit 32. Interface 24 accepts an analog input signal denoted x(t). The input signal comprises a sequence of analog pulses of a known pulse shape but unknown amplitudes and time positions (occurrence times). Sampling unit 28 samples the input signal efficiently at a low sampling rate. In some embodiments the sampling rate is equivalent to the signal's FRI, i.e., the number of degrees of freedom per unit time that characterizes the signal. Sampling unit 28 typically comprises multiple processing channels that operate in parallel. Example multi-channel sampling unit configurations are illustrated in FIGS. 3-6 below.

Unit 28 produces a sequence of digital samples. Reconstruction unit 32 processes this sample sequence so as to reconstruct signal x(t), e.g., recover the amplitudes and time positions $(a_i, t_i)$ of the pulses in x(t). Since the pulse shape is known, the reconstructed amplitudes and time positions provide a complete representation of the analog signal x(t). The reconstructed amplitudes and time positions are typically provided as output.

The system configuration of FIG. 2 is an example configuration, which is chosen purely for the sake of conceptual clarity. In alternative embodiments, any other suitable system configuration can be used. For example, in some embodiments system 20 performs sampling but not reconstruction, in which case unit 32 may be omitted.

The elements of system 20 may be implemented using hardware. Digital elements can be implemented, for example, in one or more off-the-shelf devices, Application-Specific Integrated Circuits (ASICs) or FPGAs. Analog elements can be implemented, for example, using discrete components and/or one or more analog ICs. Some system elements may be implemented, additionally or alternatively, using software running on a suitable processor, e.g., a Digital Signal Processor (DSP). Some system elements may be implemented using a combination of hardware and software elements. In one example embodiment, system 20 is implemented in a single device (e.g., IC), which accepts an analog pulse sequence as input and produces the pulse amplitudes and time positions as output.

When implementing the disclosed techniques using a programmable processor, the processor typically comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Multi-Channel Sampling Schemes for Pulse Sequences

The embodiments described herein provide methods and systems for low-rate sampling and reconstruction of pulse sequences. The following description initially addresses finite pulse sequences. A generalization to infinite pulse sequences is provided further below.

Consider an analog input signal that comprises a sequence of L pulses:

$$x(t) = \sum_{l=1}^{L} a_l h(t - t_l), \; t_l \in I \subset [0, T), \; a_l \in \mathbb{C} \quad [1]$$

wherein h(t) denotes a known pulse shape, $\{t_l, a_l\}_{l=1}^{L}$ denote the unknown time positions and amplitudes of the pulses, and I denotes a contiguous time interval in [0,T).

Generally, the disclosed techniques can be use with any desired pulse shape, as long as the signal x(t) is confined to the interval [0,T), i.e.:

$$h(t-t_l)=0, \forall t \notin [0,T), l=1 \ldots L. \quad [2]$$

Thus, the temporal support of h(t) is finite and smaller than T. The analog signal of Equation [1] is defined uniquely by the amplitudes and the time positions of the L pulses, i.e., the signal has 2L degrees of freedom. Therefore, at least 2L samples are needed to represent the signal in a manner that enables perfect reconstruction. The techniques described herein enable sampling the signal, and subsequently reconstructing the signal, using this minimal sampling rate. (Although the embodiments described herein refer mainly to pulse shapes h(t) having finite durations, the disclosed techniques are applicable to infinite-duration pulse shapes, as well.)

Since x(t) is confined to the interval t∈[0,T), the signal can be expressed using its Fourier series expansion:

$$x(t) = \sum_{k \in \mathbb{Z}} X[k] e^{j\frac{2\pi}{T}kt}, \; t \in [0, T) \quad [3]$$

wherein X[k] are Fourier coefficients given by:

$$X[k] = \frac{1}{T} \int_0^T x(t) e^{-j\frac{2\pi}{T}kt} dt \quad [4]$$

Substituting Equation [1] into Equation [4] gives:

$$X[k] = \ldots = \frac{1}{T} H\left(\frac{2\pi k}{T}\right) \sum_{l=1}^{L} a_l e^{-j\frac{2\pi}{T}kt_l} \quad [5]$$

wherein H(ω) denotes the Continuous-Time Fourier Transform (CTFT) of the pulse shape h(t), i.e., $$\int_{-\infty}^{\infty} h(t) e^{-j\omega t} d\omega.$$

Let $\varkappa$ denote a set of K consecutive indices for which $$H\left(\frac{2\pi}{T}k\right) \neq 0,$$

∀k∈ $\varkappa$. Such a set typically exists for short-time-support pulses h(t). Let H denote a K×K diagonal matrix whose $k^{th}$ diagonal element is $$\frac{1}{T} H\left(\frac{2\pi}{T}k\right).$$

Let V(t) denote an K×L matrix whose $kl^{th}$ element is $$e^{-\frac{2\pi}{T}kt_l},$$

wherein t={$t_1, \ldots t_L$} denotes a vector of the unknown time positions of the pulses. Let a denote an L-element vector whose $l^{th}$ element is $a_l$, and x denote a K-element vector whose $k^{th}$ element is the Fourier coefficient X[k]. Equation [5] can thus be written in matrix form as:

$$x = HV(t)a \quad [6]$$

Since H is invertible by construction, we can define y= $H^{-1}x$ that satisfies:

$$y = V(t)a \quad [7]$$

The $k^{th}$ element in vector y can be written explicitly as:

$$y_k = \sum_{l=1}^{L} a_l e^{-j\frac{2\pi}{T}kt_l} \quad [8]$$

Given the vector x, Equation [7] is equivalent to the problem of finding the frequencies and amplitudes of a sum of L complex sinusoids (also referred to as cissoids or complex exponentials). The frequencies of the sinusoids can be found using any suitable method. For example, the articles by Vetterli at al. and Blu et al., cited above, describe the use of an annihilating filter for this purpose. As another example, Hua and Sarkar describe a technique referred to as matrix-pencil, in "Matrix Pencil Method for Estimating Parameters of Exponentially Damped/Undamped Sinusoids in Noise," IEEE Transactions on Acoustics, Speech and Signal Processing, volume 38, no. 5, 1990, pages 814-824, which is incorporated herein by reference.

Kumaresan and Tufts describe yet another possible method in "Estimating the Angles of Arrival of Multiple Plane Waves," IEEE Transactions on Aerospace and Electronic Systems, volume AES-19, no. 1, January, 1983, pages 134-139, which is incorporated herein by reference. Another example technique is called ESPRIT, and is described by Roy and Kailath, in "ESPRIT—Estimation of Signal Parameters via Rotational Invariance Techniques," IEEE Transactions on Acoustics, Speech and Signal Processing, volume 37, no. 7, July, 1989, pages 984-995, which is incorporated herein by reference.

An additional example technique is called MUSIC, and is described by Schmidt, in "Multiple Emitter Location and Signal Parameter Estimation," IEEE Transactions on Antennas and Propagation, volume 34, no. 3, March, 1986, pages 276-280, and by Bienvenu and Kopp, in "Adaptivity to Background Noise Spatial Coherence for High Resolution Passive Methods," IEEE International Conference on Acoustics, Speech and Signal Processing, volume 5, April, 1980, pages 307-310, which are incorporated herein by reference.

This problem of finding the frequencies of the sinusoids can be solved as long as K≥2 L and the time positions are distinct, i.e., $t_i \neq t_j$ for all i≠j. The solution provides the time positions of the pulses. Once the pulse time positions are known, the linear set of equations in Equation [7] can be solved, e.g., using a least-squares process, to derive the pulse amplitudes. Since matrix V is a Vandermonde matrix, it is left-invertible as long as K≥L, so that $a = V^{\dagger}(t)y$, wherein the † symbol denotes Moore-Penrose pseudo-inverse.

The description above shows that spectral analysis methods (e.g., annihilating filter) can be used by reconstruction unit 32 to calculate the time positions and amplitudes $\{t_l, a_l\}_{l=1}^{L}$ of the pulses in signal x(t) from a given vector x of K≥2 L Fourier series coefficients. In practice, however, the signal x(t) is sampled in time domain, in which case there is no direct access to the Fourier coefficients, i.e., to the elements of vector x. The following description shows an example multichannel sampling scheme that obtains the elements of vector x from time-domain samples of x(t).

Figure 3:
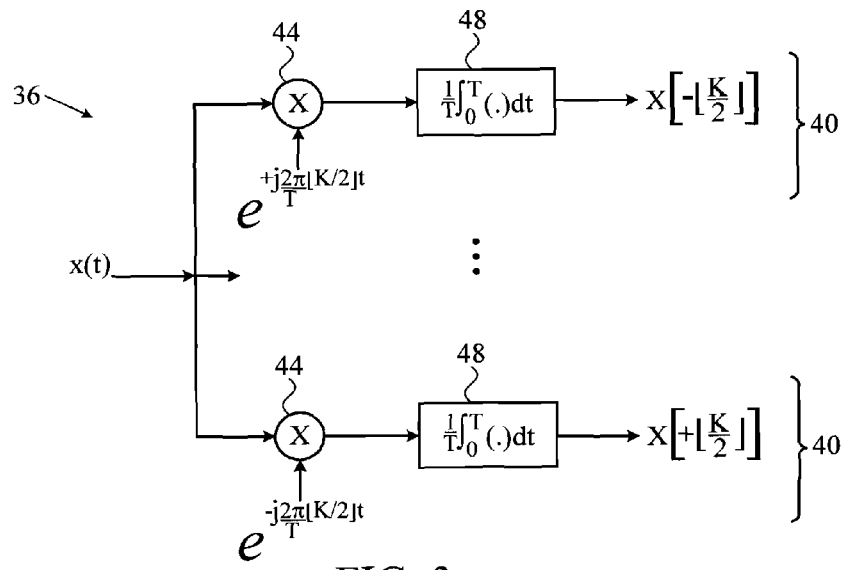
FIGS. 3-6 are block diagrams that schematically illustrate sampling units, in accordance with embodiments of the present invention.

FIG. 3 is a block diagram that schematically illustrates a sampling unit 36, in accordance with an embodiment of the present invention. Unit 36 can be used, for example, to implement sampling unit 28 in system 20 of FIG. 2 above. Unit 36 distributes the analog input signal x(t) to K processing channels 40 that operate in parallel to one another. In the present example the number of channels K is odd, and the set ϰ is chosen as $\varkappa = \{-\lfloor K/2 \rfloor, \ldots, \lfloor K/2 \rfloor\}$. Alternatively, however, any other suitable set of at least 2 L consecutive indices can be used.

Each processing channel comprises a respective mixer 44 and a respective integrator 48. In the $k^{th}$ processing channel ($k = -\lfloor K/2 \rfloor, \ldots, \lfloor K/2 \rfloor$), mixer 44 mixes x(t) with a modulating waveform (complex sinusoid in this case) given by $$e^{-j\frac{2\pi}{T}kt}.$$

Following the mixing operation, integrator 48 in the $k^{th}$ processing channel integrates the mixed signal over the time interval [0,T]. The output of integrator 48 of the $k^{th}$ processing channel is the $k^{th}$ Fourier coefficient X[k] defined in Equation [4] above. Each processing channel typically comprises a respective sampler (not shown in the figure) that samples the integrator output at the end of time interval [0,T].

Thus, sampling unit 36 derives a set of K Fourier coefficients of x(t). Reconstruction unit 32 may reconstruct the amplitudes and time positions of the pulses in x(t) from these Fourier coefficients, e.g., using any of the above-described spectral analysis methods.

In an example embodiment, sampling unit 36 can be implemented using hardware components such as oscillators (for producing the modulating waveforms mixed with the analog input signal), mixers and integrators. Typically, the oscillator frequencies are exact multiples of some base frequency.

In the embodiments described herein, each processing channel mixes the analog input signal with a modulating waveform, then integrates the mixed signal over a time interval, and then digitizes the integration result. The disclosed techniques, however, are not limited to integration, and may perform other types of filtering after mixing the input signal with the modulating waveform. In the present context, integration over time is regarded as one possible kind of filtering. In alternative embodiments, each processing channel mixes the analog input signal with a modulating waveform, then filters the mixed signal using a suitable filter, and then digitizes the filter output. Any suitable filter, such as, for example, a filter having a rectangular temporal response ("RECT" filter), can be used for this purpose.

In the embodiments described herein, the modulating waveforms are generated by suitable circuitry in the sampling unit. In alternative embodiments, the modulating waveforms may be accepted from an external source or system.

Figure 4:
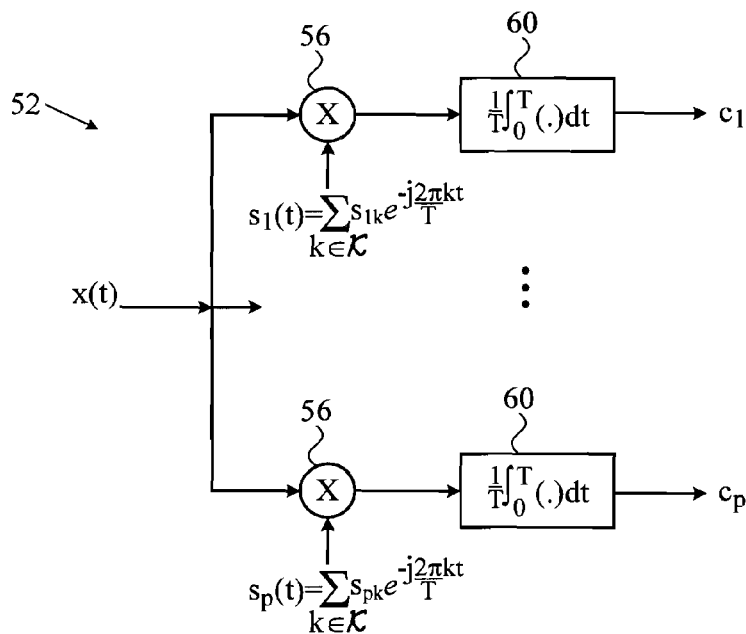

FIG. 4 is a block diagram that schematically illustrates a sampling unit 52, in accordance with an alternative embodiment of the present invention. Unit 52 can be used, for example, to implement sampling unit 28 in system 20 of FIG. 2 above. In the embodiment of FIG. 4, the sampling unit comprises p processing channels operating in parallel to one another, p≥K. The $i^{th}$ processing channel comprises a mixer 56 that mixes x(t) with a respective modulating waveform denoted $s_i(t)$, followed by an integrator 60 that integrates the mixer output over the time interval [0,T]. A respective sampler (not shown in the figure) samples the integrator output at the end of time interval [0,T].

Unlike sampling unit 36 of FIG. 3, in sampling unit 52 of FIG. 4 each modulating waveform comprises a finite weighted sum of complex sinusoids:

$$s_i(t) = \sum_{k \in \varkappa} s_{ik} e^{-j\frac{2\pi}{T}kt} \quad [9]$$

wherein $s_{ik}$ denote the weights of the complex sinusoids in the modulating waveform of the $i^{th}$ processing channel. Each processing channel uses a different set of weights. The digital sample at the output of integrator 60 in the $i^{th}$ processing channel is denoted $c_i$. In some embodiments, reconstruction unit 32 reconstructs analog input signal x(t) (e.g., recovers the amplitudes and time positions of the pulses in the signal) from the outputs of the p processing channels.

Each modulating waveform $s_i(t)$ in sampling unit 52 is a weighted sum of the modulating waveforms (single complex sinusoids) used in sampling unit 36 of FIG. 3. Therefore, the output of each processing channel in sampling unit 52 ($c_i$) is a weighted sum of the K Fourier coefficients of x(t), with different processing channels using different sets of weights.

The fact that each processing channel produces a different superposition of the Fourier coefficients, rather than a single coefficient, is advantageous for several reasons. For example, in some embodiments p is chosen to be larger than K, and this configuration provides a degree of redundancy and robustness against processing channel failures. As noted above, perfect reconstruction is possible given a set of K consecutive Fourier coefficients of x(t). If one or more of the processing channels fail (e.g., because of equipment failure or noise corruption) reconstruction unit 32 may still be able to reconstruct the K consecutive Fourier coefficients from the outputs of the remaining functional processing channels.

Another advantage of this scheme is that modulating waveforms $s_i(t)$ of sampling unit 52 are sometimes simpler to implement than the single complex sinusoids of sampling unit 36. In an example embodiment, waveforms $s_i(t)$ are generated digitally using a single digital oscillator. Both features (resilience to failure and waveform generation) are addressed in greater detail further below.

The digital sample $c_i$ produced by the $i^{th}$ processing channel can be written as:

$$c_i = \frac{1}{T}\int_0^T x(t)\sum_{k \in \chi} s_{ik} e^{-j\frac{2\pi}{T}kt} dt = \sum_{k \in \chi} s_{ik} X[k] \quad [10]$$

In order to relate digital samples $c_i$ to Fourier coefficients X[k], let S denote a p×K matrix whose $ik^{th}$ element is $s_{ik}$. Let c denote a p-element vector whose $i^{th}$ element is $c_i$. Equation [10] can now be written in matrix form as:

$$c = Sx \quad [11]$$

As long as matrix S has full column rank, for which p≥K is a necessary condition, it is possible for reconstruction unit 32 to recover vector x from the vector of digital samples c by computing $x = S^{\dagger}c$. The sampling scheme of FIG. 3 above can be viewed as a special case of this scheme with p=K and S=I.

Sampling unit 52 may use any suitable modulating waveform that fits the format of equation [9] above. In some embodiments, the modulating waveforms are sine and cosine waveforms. In an example embodiment, p=K, the first [K/2] modulating waveforms are chosen to be $$\cos\left(\frac{2\pi}{T}kt\right),$$

the next [K/2] modulating waveforms are chosen to be $$\sin\left(\frac{2\pi}{T}kt\right),$$

and the last modulating waveform is chosen to be unity (1). This choice of modulating waveforms meets the format of Equation [9] and also produces an invertible matrix S. One advantage of this scheme is that the modulating waveforms are real-valued rather than complex, and therefore may be simpler to generate than complex sinusoids.

In another example embodiment each modulating waveform comprises a certain periodic waveform that is filtered by a low-pass or band-pass filter. Any periodic waveform can be represented by a Fourier series expansion, which comprises an infinite sum of weighted complex sinusoids. The filtering operation retains a finite number of these sinusoids, so as to meet the format of Equation [9]. Several example waveforms generated in this manner, and associated design considerations, are described further below. With properly chosen periodic waveforms, matrix S is left-invertible. One example of a periodic waveform is a periodic stream of rectangular pulses that is generated digitally. Alternatively, however, any other suitable set of periodic waveforms and any suitable filtering operation can be used.

The embodiments described above address finite pulse sequences. As can be appreciated, these techniques are similarly applicable to infinite periodic pulse sequences, since they can be represented by Fourier series in a similar manner.

Certain aspects related to the generation and use of periodic waveforms are addressed By Mishali et al., in "Xampling: Signal Acquisition and Processing in Union of Subspaces," CIT Report 747, Department of Electrical Engineering, Technion—Israel Institute of Technology, volume 1704, October, 2009; by Mishali and Eldar, in "From Theory to Practice: Sub-Nyquist Sampling of Sparse Wideband Analog Signals," IEEE Journal on Selected Topics in Signal Processing, volume 4, no. 2, April, 2010, pages 375-391; and by Matusiak and Eldar, in "Sub-Nyquist Sampling of Short Pulses: Part I," arXiv: 1010.3132v1, Oct. 15, 2010, which are incorporated herein by reference, as well as in PCT International Publication WO 2010/095083, and U.S. Provisional Patent Application 61/392,671, whose disclosures are incorporated herein by reference.

Sampling Infinite Pulse Sequences

The description above addressed finite pulse sequences. The following description generalizes the disclosed techniques to infinite streams of pulses. Consider an analog input signal given by:

$$x(t) = \sum_{l \in \mathbb{Z}} a_l h(t - t_l), \, t_l \in \mathbb{R}, \, a_l \in \mathbb{C} \quad [12]$$

and assume that any interval $I_m \equiv [*m-1)T, mT]$, $m \in \mathbb{Z}$ contains no more than L pulses. Assume also that Equation [2] above holds within each interval, such that the intervals are independent of one another. The maximum number of degrees of freedom per unit time, i.e., the rate of innovation, in this case is 2 L/T. The following description shows a multi-channel sampling and reconstruction scheme for such a signal, which is able to sample the signal at the rate of innovation and enable perfect reconstruction.

Figure 5:
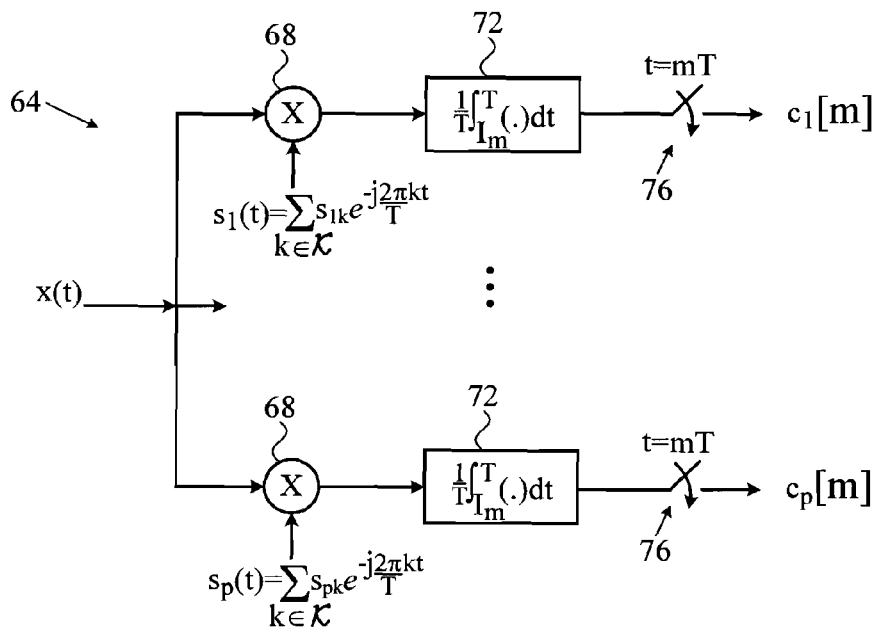

FIG. 5 is a block diagram that schematically illustrates a sampling unit 64, in accordance with an embodiment of the present invention. Sampling unit 64 comprises p processing channels, each comprising a respective mixer 68 followed by a respective integrator 72. The mixers in the p processing channels mix the analog input signal x(t) with the respective modulating waveforms $s_i(t)$, similarly to the scheme of FIG. 4 above.

In the present embodiment, however, integrator 72 in each processing channel is re-initialized after each interval $I_m$. A sampler 76 in each processing channel samples the integrator output at the end of each time interval $I_m$ (i.e., every T seconds). Thus, the $i^{th}$ processing channel outputs a sequence of digital samples denoted $c_i[m]$, such that the sample $c_i[m]$ is the integral of the mixed input signal over the interval $I_m$.

Since the sample $c_i[m]$ is influenced only by the interval $I_m$, the infinite problem is equivalent to a sequence of finite streams of pulses. The resulting samples, in matrix notation, are given by $$c[m]=Sx[m] \quad [13]$$

wherein the vector $x[m]$ contains the Fourier series coefficients of the signal within the $m^{th}$ time interval $I_m$. As long as matrix S is left-invertible, reconstruction unit 32 may obtain the sequence of Fourier series coefficients by computing $x[m]=S^{\dagger}c[m]$.

For this infinite case, Equation [7] above can be generalized to obtain:

$$y[m]=H^{-1}x[m]=V(t[m])a[m] \quad [14]$$

wherein $t[m]$ and $a[m]$ denote vectors containing the time positions and amplitudes of the pulses in the interval $I_m$, respectively. Matrix V is the same as in Equation [6] above. For each m, Equation [14] represents a sum-of-cisoids problem, as explained above, and can therefore be solved as long as $K \geq 2L$. Choosing $p=K=2L$ provides a sampling scheme that samples $x(t)$ at the rate of innovation, and enables perfect reconstruction of an infinite stream of pulses.

A special case of the finite pulse stream of Equation [12] is when the signal $x(t)$ has a Shift Invariance (SI) structure. Signals having this property are addressed, for example, by Gedalyahu and Eldar, in "Time Delay Estimation from Low Rate Samples: A Union of Subspaces Approach," IEEE Transactions on Signal Processing, volume 58, no. 6, June, 2010, pages 3017-3031, which is incorporated herein by reference.

In such a signal, in each period T, the time positions of the pulses are constant relative to the beginning of the period. The signal can thus be written as:

$$x(t) = \sum_{m \in \mathbb{Z}} \sum_{l=1}^{L} a_l[m]h(t-t_l-mT), t_l \in I \subset [0, T) \quad [15]$$

wherein $a_l[n] \in l_2$ denotes the amplitude of the $l^{th}$ pulse in the $m^{th}$ period. Assuming Equation [2] above holds, Equation [14] can be written as:

$$y[m]=V(t)a[m] \quad [16]$$

since in the present case the time positions in each period are constant. In Equation [16], $a[m]$ denotes an L-element vector whose $l^{th}$ element is $a_l[m]$.

For SI signals, the $p \geq 2L$ condition on the number of processing channels is still a sufficient condition. However, the SI property can be used to reduce the number of processing channels below 2 L while still enabling perfect reconstruction. Based on results obtained in the article by Gedalyahu and Eldar, cited above, the pulse time positions and vectors $a[m]$ can be recovered uniquely from Equation [16] provided that $$K \geq 2L-\eta+1 \quad [17]$$

wherein $$\eta=dim(\text{span}(\{a[m], m \in \mathbb{Z}\})) \quad [18]$$

denotes the dimension of the minimal subspace containing the vector set $\{a[m], m \in \mathbb{Z}\}$. The condition in Equation [17] implies that in some cases K, and thus the number of channels p, can be reduced below 2 L that was set on the general signal model, depending on the value of $\eta$.

In some embodiments, reconstruction unit 32 may recover the pulse time positions from Equation [16] using subspace techniques such as the ESPRIT or MUSIC techniques, cited above. Subspace techniques typically require that $\eta=L$ in order to achieve the lowest bound of Equation [17], i.e., to recover the pulse time positions using only $p \geq L+1$ processing channels. When $\eta<L$, additional smoothing may be needed before applying the subspace techniques, and $p \geq 2L$ processing channels may be required. Suitable smoothing methods are described, for example, by Shan et al., in "On Spatial Smoothing for Direction-Of-Arrival Estimation of Coherent Signals," IEEE Transactions on Acoustics, Speech and Signal Processing, volume 33, no. 4, August, 1985, pages 806-811, which is incorporated herein by reference. Alternatively, any other suitable smoothing scheme can be used.

In summary, when the pulse amplitudes vary sufficiently (e.g., by at least a predefined amount of variation) from one period to another (expressed by the condition $\eta=L$), the common information regarding pulse time positions can be used to reduce the sampling rate of sampling unit 64 to $(L+1)/T$. Under these conditions, perfect reconstruction can be achieved using as few as 2 L processing channels. This scheme typically estimates the pulse time positions jointly from multiple periods. This scheme achieves improved accuracy in estimating the pulse time positions, since it exploits the commonality in time positions in different periods rather than estimating the time positions separately for each period.

Synchronization between Processing Channels

In some embodiments, the multi-channel sampling schemes described herein assume that the multiple processing channels are time-synchronized to one another. The sampling unit may synchronize the processing channels using any suitable method. In one embodiment, the sampling unit comprises a zero-delay synchronization device that produces accurate trigger signals for the integrators and samplers in the multiple processing channels. Zero-delay synchronization devices are described, for example, in the article by Mishali and Eldar, cited above, and by Gentile, in "Introduction to Zero-Delay Clock Timing Techniques," Analog Devices Corp. Application Note AN-0983, 2008, which is incorporated herein by reference.

In alternative embodiments, system 20 carries out a pre-calibration process in which the relative delays between the processing channels are measured and compensated for. The calibration process may be performed during manufacturing or power-up, e.g., by stimulating system 20 with a known input signal.

In some embodiments, system 20 measures the relative delays, and compensates for the delays in the sampling and reconstruction process. Assume, for example, that the $i^{th}$ processing channel has a delay of $\Delta_i \in [-\Delta_{max}, \Delta_{max}]$ relative to the optimal sampling times $t=nT$, wherein $\Delta_{max}$ denotes the maximal expected delay. We assume that for each time interval T:

$$t(t-t_l)=0, \forall t \notin [\Delta_{max}, T-\Delta_{max}) \; l=1 \ldots L \quad [19]$$

This condition ensures that each time interval can be processed independently for delay compensation. The effective delay of the $l^{th}$ pulse measured in the $i^{th}$ processing channel is $t_l-\Delta_i$. Substituting this into Equation [5] above, the $k^{th}$ Fourier coefficient measured in the $i^{th}$ processing channel satisfies:

$$X_i[k] = \frac{1}{T}H\left(\frac{2\pi k}{T}\right)\sum_{l=1}^{L}a_l e^{-j\frac{2\pi}{T}k(t_l-\Delta_i)} = e^{-j\frac{2\pi}{T}k\Delta_i}X[k] \quad [20]$$

Therefore, from Equation [10] we get:

$$c_i = \sum_{k \in \varkappa} s_{ik} e^{-j\frac{2\pi}{T}k\Delta_i} X[k] = \sum_{k \in \varkappa} \widetilde{s_{ik}} X[k] \quad [21]$$

wherein $$\widetilde{s_{ik}} \equiv s_{ik} e^{-j\frac{2\pi}{T}k\Delta_i} \quad [22]$$

Thus, in these embodiments, when the relative delays between the processing channels are known, the effective weight matrix of the system is $\tilde{S}$, whose elements are $\widetilde{s_{ik}}$, instead of S. The reconstruction unit may compensate for the misalignment between the processing channels by inverting $\tilde{S}$.

Generation of Periodic Modulating Waveforms

As noted above, in some embodiments the modulating waveforms used in the sampling scheme of FIG. 4 are filtered periodic waveforms that satisfy Equation [9]. Generation and filtering of the periodic waveforms is typically carried out by the sampling unit. Consider a set of p periodic functions denoted $p_i(t)$. These functions can be expressed using Fourier series expansion:

$$p_i(t) = \sum_{k \in \mathbb{Z}} d_i[k] e^{j\frac{2\pi}{T}kt} \quad [23]$$

wherein the $k^{th}$ Fourier series coefficient of $p_i(t)$ is given by:

$$d_i[k] = \frac{1}{T}\int_0^T p_i(t) e^{-j\frac{2\pi}{T}kt}dt \quad [24]$$

The summation in Equation [23] is typically infinite, in contrast to the finite summation in Equation [9]. Therefore, $p_i(t)$ is filtered by a shaping filter whose time-domain response is g(t), which rejects the unwanted elements in the summation of Equation [25]. The periodic functions after filtering are given by:

$$\tilde{p}_i(t) = p_i(t) * g(t) \quad [25]$$

The filtered periodic functions are also periodic, and can therefore be written as:

$$\tilde{p}_i(t) = \sum_{k \in \mathbb{Z}} \tilde{d}_i[k] e^{j\frac{2\pi}{T}kt} \quad [26]$$

wherein $$\tilde{d}_i[k] = d_i[k] G\left(\frac{2\pi}{T}k\right) \quad [27]$$

wherein G(ω) denotes the CTFT of g(t). From Equation [27], the filter g(t) has to satisfy $$G(\omega) = \begin{cases} \text{nonzero} & \omega = \frac{2\pi}{T}k, k \in \varkappa \\ 0 & \omega = \frac{2\pi}{T}k, k \notin \varkappa \\ \text{arbitrary} & \text{otherwise} \end{cases} \quad [28]$$

so that $\tilde{d}_i[k]=0, \forall k \notin \varkappa$.

Examples of filters that satisfy this condition are described in a U.S. Patent Application entitled "Low-Rate Sampling of Pulse Streams," Attorney Docket no. 1064-1008, whose disclosure is incorporated herein by reference. One example is a Sum-of-Sincs (SoS) filter whose frequency-domain response comprises a sum of sinc functions. In alternative embodiments, any other suitable shaping filter can be used. One example filter, which is addressed in U.S. Provisional Patent Application 61/328,228, cited above, is a Chebyshev Type I filter.

Equation [28] implies that the frequency response of g(t) is specified only in a discrete set of points $$\omega = \frac{2\pi}{T}k, k \in \mathbb{Z}.$$

This condition allows considerable freedom in designing a practical analog filter. When implementing a low-pass filter, for example, the transition between the filters pass-band and stop-band can be smooth with a width of $$\frac{2\pi}{T}.$$

Figure 6:
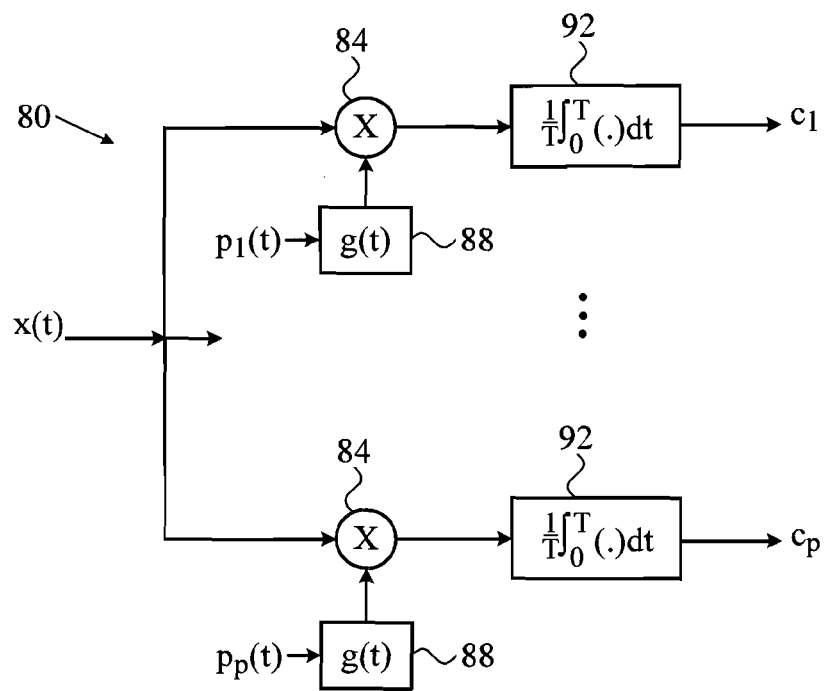

FIG. 6 is a block diagram that schematically illustrates a sampling unit 80, in which the modulating waveforms comprise filtered periodic functions, in accordance with an embodiment of the present invention. Sampling unit 80 can be used, for example, for implementing sampling unit 28 in system 20 of FIG. 1 above.

Sampling unit 80 comprises p processing channels operating in parallel. Each processing channel comprises a respective mixer 84 that mixes input signal x(t) with a respective modulating waveform. Each mixer is followed by a respective integrator 92 that integrates the mixer output over the time interval [0,T). Each integrator output is sampled by a sampler (not shown) at t=T. The modulating waveform in the $i^{th}$ processing channel is generated by filtering a periodic function $p_i(t)$ with a filter 88 whose time-domain response is g(t).

The elements of matrix S in this embodiment are given by:

$$S_{ik} = \tilde{d}_i[-(k-\lfloor K/2 \rfloor)] \quad [29]$$

Matrix S can be ensured to be invertible by proper choice of the periodic functions $p_i(t)$. The following description presents an example set of periodic functions that simplifies matrix S.

In some embodiments, the periodic functions are chosen as:

$$p_i(t) = \sum_{m \in \mathbb{Z}} \sum_{n=0}^{N-1} \alpha_i[n] p\left(t - \frac{nT}{N} - mT\right), i = 1, \ldots, p \quad [30]$$

wherein p(t) denotes a certain pulse shape and $\alpha_i[n]$ denotes a length-N binary (±1) sequence. It can be shown that the Fourier series coefficients $d_i[k]$ of $p_i(t)$ are given by:

$$d_i[k] = \frac{1}{T}\sum_{n=0}^{N-1} \alpha_i[n] P\left(\frac{2\pi}{T}k\right) e^{-j\frac{2\pi}{N}kn} \quad [31]$$

wherein $P(\omega)$ denotes the CTFT of p(t).

By combining Equation [31] with Equations [29] and [27] we get:

$$S_{ik} = \frac{1}{T}\sum_{n=0}^{N-1} \alpha_i[n] P\left(\frac{2\pi}{T}k'\right) G\left(\frac{2\pi}{T}k'\right) e^{-j\frac{2\pi}{N}k'n} \quad [32]$$

wherein $k'=-(k-\lfloor K/2 \rfloor)$. The resulting matrix S can be decomposed as $$S = AW\Phi \quad [33]$$

wherein A is a p×N matrix whose $in^{th}$ element is $\alpha_i[n]$, W is a N×K matrix whose $nk^{th}$ element is $$e^{-j\frac{2\pi}{N}k'n},$$

and $\Phi$ is a K×K diagonal matrix whose $k^{th}$ diagonal element is:

$$\Phi_{kk} = \frac{1}{T} P\left(\frac{2\pi}{T}k'\right) G\left(\frac{2\pi}{T}k'\right) \quad [34]$$

It can be shown that Matrix S of Equation [33] is left invertible if the following set of conditions is met:

p≥K, N≥K.

The frequency response of shaping filter g(t) satisfies Equation [28].

The frequency response of the pulse p(t) satisfies $$P\left(\frac{2\pi}{T}k\right) \neq 0,$$

$\forall k \in \varkappa$.

The sequences $\alpha_i[n]$ are chosen such that the matrix AW has full column rank.

One example of a configuration that meets the above conditions is when the sequences $\alpha_i[n]$ comprise cyclic shifts of a base sequence $\alpha[n]$:

$$\alpha_i[n] = \alpha[n-i+1 \mod N] \quad [35]$$

wherein we assume p=N. This set of modulating waveforms can be generated using only a single sequence generator, such that each processing channel is provided with a cyclically-shifted version of the generator output. The $i^{th}$ processing channel is provided with a version of the sequence that is delayed by (i−1)T/N time units. Such a configuration simplifies the hardware design of the sampling unit, for example in comparison with the scheme of FIG. 2 that comprises multiple different frequency sources.

In the above example, matrix A is a circulant matrix, which can be decomposed as:

$$A = F^H \text{diag}(F\alpha) F \quad [36]$$

wherein the $()^H$ operator denotes conjugate transposition, F is an N×N unitary Discrete Fourier Transform (DFT) matrix, and $\alpha$ denotes a length-N vector containing the elements of the base sequence $\alpha[n]$. For A to be invertible, the DFT of the sequence $\alpha[n]$ should not have any zero values.

Figure 7A:
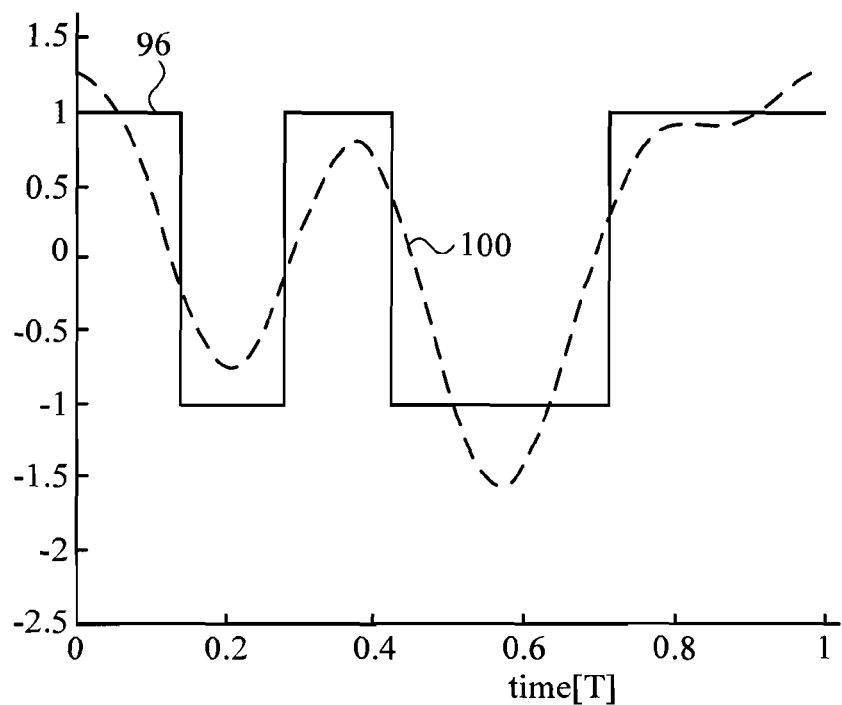
FIGS. 7A and 7B are graphs showing modulating waveforms, in accordance with an embodiment of the present invention.
Figure 7B:
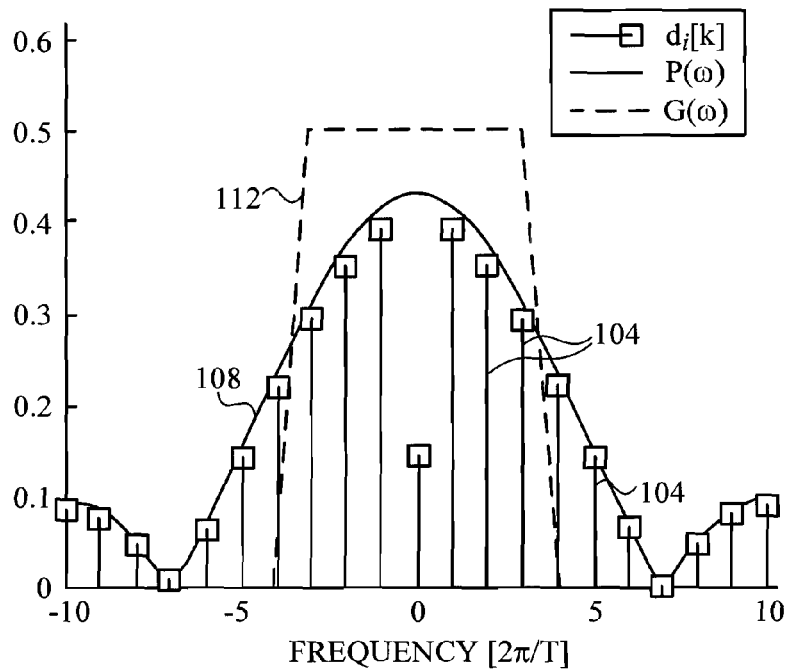

FIGS. 7A and 7B are graphs showing modulating waveforms, in accordance with an embodiment of the present invention. These figures show the modulating waveforms for a particular example choice of parameters. In the present example, p=N=K, and the pulse p(t) is chosen to be 1 (unity) for $$t \in \left[0, \frac{T}{N}\right]$$

and zero otherwise.

The frequency response of this pulse satisfies:

$$P(\omega) = \frac{T}{N} e^{-j\frac{T}{2N}\omega} \cdot \text{sinc}\left(\frac{T}{2\pi N}\omega\right) \quad [37]$$

and therefore $$\left|P\left(\frac{2\pi}{T}k\right)\right| = \frac{T}{N} \cdot \text{sinc}\left(\frac{k}{N}\right) \quad [38]$$

and the latter expression is non-zero for any $k \in \varkappa$.

The sequences $\alpha_i[n]$ are chosen to be binary sequences of ±1 values, generated as different cyclic shifts of a certain base sequence, in a manner that A is invertible. Such rectangular pulse trains with alternating signs can be generated, for example, using pulse generation hardware that is described in the article by Mishali and Eldar, cited above. Such digitally-generated modulating waveforms may be generated using digital hardware that is relatively simple, low cost and repeatable. Moreover, this waveform generation technique is flexible and can be easily adapted to modifications of system parameters, e.g., variations in T.

The example shown in FIGS. 7A and 7B demonstrates one of the modulating waveforms in the time and frequency domains, respectively, for p=N=K=7. In FIG. 7A, a curve 96 shows the original periodic function $p_i(t)$, which in the present example comprises an alternating sequence of "1" and "−1" values. A curve 100 shows this function after filtering with the shaping filter g(t). In FIG. 7B, data points 104 show the Fourier series coefficients $d_i[k]$ of $p_i(t)$. A curve 108 shows $P(\omega)$, the CTFT of pulse shape p(t). A curve 112 shows $G(\omega)$, the CTFT of the shaping filter g(t), which is designed to pass only the Fourier series coefficients whose index is in the $\varkappa = \{-3, \ldots, 3\}$ and suppress all other coefficients.

As noted above, when the number of processing channels p is larger than N, the scheme of FIG. 4 has a certain degree of robustness against processing channel failures, because each Fourier coefficient X[k] appears in multiple processing channels. Let $p_e$ denote the maximal expected number of failed processing channels, and assume that $p \geq N+p_e$. In order to guarantee unique recovery of x from the remaining functional processing channels, the sub-matrix $\tilde{S}$, which is obtained from matrix S by removing the rows corresponding to the failed processing channels, should be left invertible. This condition should be satisfied for any choice of up to $p_e$ rows.

Therefore, matrix S should be designed such that any p−$p_e$ rows form a rank-K matrix. In an embodiment, assume that $p \geq 2p_e$ and that two different sequence generators are used. In this embodiment, half of the processing channels are provided with modulating waveforms that are cyclically-shifted versions of the sequence generated by one generator. The other half of the processing channels are provided with modulating waveforms that are cyclically-shifted versions of the sequence generated by the other generator. The condition above can be satisfied by proper choice of the two sequences generated by the two generators.

In one example embodiment, L=4, N=K=9, and p=18. Each of the two generators generates a different base sequence of randomly-chosen ±1 values. This choice of parameters provides good protection against failure of up to six processing channels. In alternative embodiments, any other suitable choice of parameters can be used.

Sampling and Reconstruction Method Description

Figure 8:
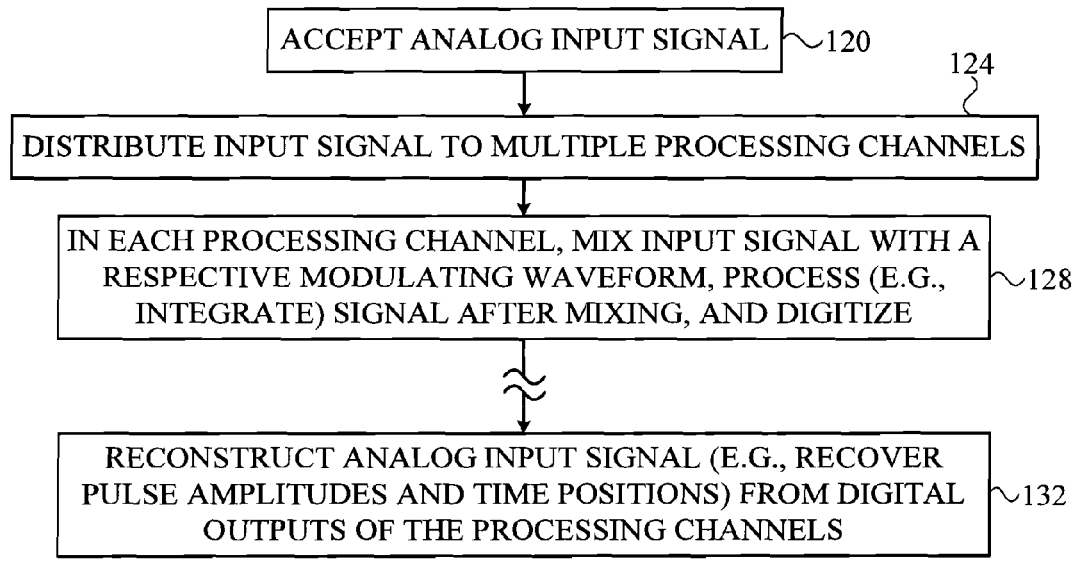
FIG. 8 is a flow chart that schematically illustrates a method for sampling and reconstruction of analog pulse sequences, in accordance with an embodiment of the present invention.

FIG. 8 is a flow chart that schematically illustrates a method for sampling and reconstruction of analog pulse sequences, in accordance with an embodiment of the present invention. The method begins with input interface 24 of system 20 accepting an analog input signal, at an input step 120. The analog input signal comprises a sequence of pulses having a known pulse shape but unknown amplitudes and time positions.

Sampling unit 28 (e.g., any of the sampling units of FIGS. 3-6) distributes the analog input signal to multiple processing channels, at a distribution step 124. Each processing channel processes the analog input signal, at a channel processing step 128. Typically, each processing channel mixes the analog input signal with a respective modulating waveform using a respective mixer, integrates the mixer output using a respective integrator, and samples (digitizes) the integrator output to produce a digital sample. Reconstruction unit 32 reconstructs the analog input signal (e.g., recovers the pulse time positions and amplitudes) from the digital samples produced by the multiple processing channels, at a reconstruction step 132.

EXAMPLE APPLICATIONS

As noted above, the disclosed techniques can be used for signal sampling and reconstruction in a wide variety of applications that process sequences of analog pulses. For example, in some imaging applications, a transmitter irradiates target tissue with a short ultrasound pulse. The pulse is reflected from various points in the tissue, due to variations in the acoustic impedance. Typically, reflections occur at boundaries between different tissue types. These reflections are sometimes referred to as ultrasound echoes.

The reflections are received, recorded and analyzed by a receiver. The reflections of a given pulse can be modeled as a finite sequence of pulses having a known pulse shape. The time positions of the pulses are indicative of the locations of the tissue type boundaries or other scatterers, and the pulse amplitudes are indicative of the differences in acoustic impedance between the tissue types. Both time positions and amplitudes are important for diagnosing the scanned tissue. In some embodiments, the disclosed techniques are used for sampling the ultrasound reflections and for calculating the pulse amplitudes and time positions.

In another example application, a radar system comprises a transmitter that transmits Radio Frequency (RF) pulses, and a receiver that analyzes reflections of these pulses from possible targets. The reflections of a given radar pulse can be modeled as a sequence of pulses having a known pulse shape. The time positions of the reflected pulses are indicative of the ranges from the targets. The pulse amplitudes are indicative of the Radar Cross Section (RCS) of the targets. In some embodiments, the disclosed techniques are used for sampling the radar pulse reflections and for calculating the pulse amplitudes and time positions.

The ultrasound imaging and radar applications are described purely by way of example. In alternative embodiments, the disclosed techniques can be used in any other suitable application, such as in other medical imaging applications, communication applications, and many others. The particular design of input interface 24 may vary from one application to another, and typically depends on the type of signal that carries the pulse sequence (e.g., ultrasound signal, communication signal, radar signal, image signal or biological signal).

The embodiments described herein refer mainly to lowering the sampling rate at which the analog input signal (analog pulse sequence) is sampled. In alternative embodiments, however, the analog input signal can be sampled at a high sampling rate, and the sampled signal can then be processed using the disclosed techniques. A scheme of this sort is useful, for example, in applications where high sampling rate is tolerable but storage space or digital processing is to be reduced.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    accepting an analog input signal comprising a sequence of pulses of a given pulse shape;
    distributing the analog input signal to multiple processing channels operating in parallel; and
    sampling the analog input signal by performing, in each of the multiple processing channels, the operations of:
        applying to the analog input signal a respective mixing and filtering operation that filters and mixes the analog input signal with a different, respective modulating waveform to produce a filtered mixed signal; and
        digitizing the filtered mixed signal to produce a respective digital channel output.

2. The method according to claim 1, wherein applying the operation comprises integrating the signal over time.

3. The method according to claim 1, wherein the sequence of the pulses has a given rate of innovation, defined as a given number of degrees of freedom per unit time, and wherein sampling the analog input signal comprises digitizing the filtered mixed signal at an aggregate sampling rate, aggregated over the multiple processing channels, that is commensurate with the rate of innovation.

4. The method according to claim 1, wherein each modulating waveform comprises a different, respective complex sinusoid.

5. The method according to claim 1, wherein each modulating waveform comprises a different, respective weighted sum of complex sinusoids.

6. The method according to claim 1, and comprising generating each modulating waveform by filtering a respective periodic waveform using a respective shaping filter.

7. The method according to claim 6, wherein the periodic waveform comprises a train of rectangular pulses.

8. The method according to claim 6, and comprising generating multiple different cyclic shifts of a base waveform, and using the cyclic shifts as respective periodic waveforms for the multiple processing channels.

9. The method according to claim 1, and comprising reconstructing the analog input signal from multiple digital channel outputs produced by the multiple processing channels.

10. The method according to claim 9, wherein reconstructing the analog input signal comprises recovering respective time positions and respective amplitudes of the pulses in the sequence.

11. The method according to claim 9, wherein reconstructing the analog input signal comprises, upon a failure in a subset of the processing channels, reconstructing the analog input signal from the digital channel outputs of the processing channels other than the subset.

12. The method according to claim 9, wherein reconstructing the analog input signal comprises compensating for relative time delays among the processing channels.

13. The method according to claim 9, wherein accepting the analog input signal comprises receiving multiple ultrasound echo pulses that are reflected from tissue, and wherein reconstructing the analog input signal comprises outputting respective amplitudes and time positions of the echo pulses so as to diagnose the tissue.

14. The method according to claim 9, wherein accepting the analog input signal comprises receiving multiple reflections of a radar signal, and wherein reconstructing the analog input signal comprises outputting respective amplitudes and the time positions of the reflections.

15. The method according to claim 1, wherein the sequence of the pulses is confined to a finite time interval.

16. The method according to claim 1, wherein the sequence of the pulses is infinite.

17. The method according to claim 1, wherein the sequence of the pulses is made up of successive periods, each period containing L pulses having L respective time positions within the period that do not vary from one period to another, and comprising reconstructing the analog input signal from multiple digital channel outputs produced by the multiple processing channels by estimating the L time positions jointly over two or more of the periods.

18. The method according to claim 17, wherein reconstructing the analog input signal comprises, when respective amplitudes of the pulses vary from one period to another by more than a given amount, recovering the analog input signal using L+1 processing channels.

19. The method according to claim 1, wherein accepting the analog input signal comprises receiving at least one signal type selected from a group of types consisting of an ultrasound signal, a communication signal, a radar signal, a biological signal and an image signal, which carries the sequence of the pulses.

20. Apparatus, comprising:
an input interface, which is configured to accept an analog input signal comprising a sequence of pulses of a given pulse shape; and
a sampling unit comprising multiple processing channels that operate in parallel to one another, each of which processing channels is configured to sample the analog input signal by applying to the analog input signal a respective mixing and filtering operation that filters and mixes the analog input signal with a different, respective modulating waveform to produce a filtered mixed signal, and digitizing the filtered mixed signal to produce a respective digital channel output.

21. The apparatus according to claim 20, wherein each of the processing channels is configured to apply the operation by integrating the signal over time.

22. The apparatus according to claim 20, wherein the sequence of the pulses has a given rate of innovation, defined as a given number of degrees of freedom per unit time, and wherein the sampling unit is configured to digitize the analog input signal at an aggregate sampling rate, aggregated over the multiple processing channels, that is commensurate with the rate of innovation.

23. The apparatus according to claim 20, wherein each modulating waveform comprises a different, respective complex sinusoid.

24. The apparatus according to claim 20, wherein each modulating waveform comprises a different, respective weighted sum of complex sinusoids.

25. The apparatus according to claim 20, wherein the sampling unit is configured to generate each modulating waveform by filtering a respective periodic waveform using a respective shaping filter.

26. The apparatus according to claim 25, wherein the periodic waveform comprises a train of rectangular pulses.

27. The apparatus according to claim 25, wherein the sampling unit is configured to generate multiple different cyclic shifts of a base waveform, and to use the cyclic shifts as respective periodic waveforms for the multiple processing channels.

28. The apparatus according to claim 20, and comprising a reconstruction unit, which is configured to reconstruct the analog input signal from multiple digital channel outputs produced by the multiple processing channels.

29. The apparatus according to claim 28, wherein the reconstruction unit is configured to recover respective time positions and respective amplitudes of the pulses in the sequence.

30. The apparatus according to claim 28, wherein, upon a failure in a subset of the processing channels, the reconstruction unit is configured to reconstruct the analog input signal from the digital channel outputs of the processing channels other than the subset.

31. The apparatus according to claim 28, wherein the reconstruction unit is configured to compensate for relative time delays among the processing channels.

32. The apparatus according to claim 28, wherein the input interface is configured to receive multiple ultrasound echo pulses that are reflected from tissue, and wherein the reconstruction unit is configured to output respective amplitudes and time positions of the echo pulses so as to diagnose the tissue.

33. The apparatus according to claim 28, wherein the input interface is configured to receive multiple reflections of a radar signal, and wherein the reconstruction unit is configured to output respective amplitudes and the time positions of the reflections.

34. The apparatus according to claim 20, wherein the sequence of the pulses is confined to a finite time interval.

35. The apparatus according to claim 20, wherein the sequence of the pulses is infinite.

36. The apparatus according to claim 20, wherein the sequence of the pulses is made up of successive periods, each period containing L pulses having L respective time positions within the period that do not vary from one period to another, and comprising a reconstruction unit, which is configured to reconstruct the analog input signal from multiple digital channel outputs produced by the multiple processing channels by estimating the L time positions jointly over two or more of the periods.

37. The apparatus according to claim 36, wherein the reconstruction unit is configured to recover the analog input signal using L+1 processing channels when respective amplitudes of the pulses vary from one period to another by more than a given amount.

38. The apparatus according to claim 20, wherein the input interface is configured to receive at least one signal type selected from a group of types consisting of an ultrasound signal, a communication signal, a radar signal, a biological signal and an image signal, which carries the sequence of the pulses.

\* \* \* \* \*